(12) United States Patent
Modarres-Zadeh

(10) Patent No.: US 12,143,086 B2
(45) Date of Patent: Nov. 12, 2024

(54) METHODS AND STRUCTURES FOR GENERATING SMOOTH ELECTRODES AND ELECTRODE STRUCTURES WITH A UNIFORMLY SMOOTH SURFACE

(71) Applicant: Qorvo US, Inc., Greensboro, NC (US)

(72) Inventor: Mohammad Jafar Modarres-Zadeh, Longwood, FL (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 18/394,197

(22) Filed: Dec. 22, 2023

(65) Prior Publication Data

US 2024/0235513 A1 Jul. 11, 2024

Related U.S. Application Data

(60) Provisional application No. 63/478,567, filed on Jan. 5, 2023.

(51) Int. Cl.
*H03H 3/02* (2006.01)
*H03H 9/02* (2006.01)
*H03H 9/13* (2006.01)

(52) U.S. Cl.
CPC .......... *H03H 3/02* (2013.01); *H03H 9/02015* (2013.01); *H03H 9/132* (2013.01)

(58) Field of Classification Search
CPC ....... H03H 3/02; H03H 9/02015; H03H 9/132
See application file for complete search history.

(56) References Cited

U.S. PATENT DOCUMENTS

| | | |
|---|---|---|
| 9,922,809 B2 | 3/2018 | McCarron et al. |
| 10,063,210 B2 | 8/2018 | McCarron et al. |
| 10,541,663 B2 | 1/2020 | McCarron et al. |
| 10,574,204 B2 | 2/2020 | McCarron et al. |
| 11,369,960 B2 | 6/2022 | Rivas et al. |
| 11,528,007 B2 | 12/2022 | Yusuf et al. |
| 11,824,511 B2 | 11/2023 | Deniz et al. |
| 2017/0110300 A1 | 4/2017 | McCarron et al. |
| 2019/0296710 A1 | 9/2019 | Deniz et al. |
| 2022/0131521 A1* | 4/2022 | Yusuf ................. H03H 9/02086 |
| 2022/0274104 A1 | 9/2022 | Rivas et al. |
| 2022/0416744 A1* | 12/2022 | Diep ........................ H03H 3/02 |

FOREIGN PATENT DOCUMENTS

| | | |
|---|---|---|
| CN | 115395916 A | 11/2022 |
| JP | 2008 048040 A | 2/2008 |
| WO | 2018/009154 A1 | 1/2018 |

OTHER PUBLICATIONS

International Search Report and Written Opinion mailed May 7, 2024 in Application No. PCT/US2023/084943, 14 pages.
Iriarte et al., "Synthesis of c-axis-oriented AlN thin films on high-conducting layers: Al, Mo, Ti, TiN, and Ni." IEEE Transactions on Ultrasonics, Ferroelectrics, and Frequency Control, IEEE, USA, vol. 52, No. 7, Jul. 31, 2005, pp. 1170-1174.

(Continued)

*Primary Examiner* — Jonathan Han
(74) *Attorney, Agent, or Firm* — Haynes and Boone, LLP

(57) ABSTRACT

Resonator structures are provided, as well as methods and structures for generating smooth electrodes and electrode structures with a uniformly smooth surface.

20 Claims, 12 Drawing Sheets

(56) References Cited

OTHER PUBLICATIONS

Perez-Campos et al., "Post-CMOS compatible high-throughput fabrication of AlN-based piezoelectric microcantilevers", Journal of Micromechanics and Microengineering, Institute of Physics Publishing, Bristol, GB, vol. 25, No. 2, Jan. 15, 2015, p. 25003.
Durmus et al., "Acoustic-Based Biosensors," Encyclopedia of Microfluidics and Nanofluidics, New York, 2014, 15 pages.
Zhang et al., "Recent Advances in Acoustic Wave Biosensors for the Detection of Disease-related Biomarkers: A review," 14 pages, 2021.
Nair et al., "Acoustic Biosensors and Microfluidic Devices in the Decennium: Principles and Applications," 71 pages, 2021.

* cited by examiner

METHODS AND STRUCTURES FOR GENERATING SMOOTH ELECTRODES AND ELECTRODE STRUCTURES WITH A UNIFORMLY SMOOTH SURFACE

CROSS-REFERENCE TO RELATED APPLICATION

This application is related to and claims the benefit of the priority date of U.S. Provisional Application No. 63/478,567 filed on Jan. 5, 2023, and entitled "Methods And Structures For Generating Smooth Electrodes And Electrode Structures With A Uniformly Smooth Surface," which is incorporated herein by reference in its entirety.

FIELD OF THE INVENTION

The present invention relates to resonator structures, and more particularly to methods and structures for generating smooth electrodes and electrode structures with a uniformly smooth surface

BACKGROUND OF THE INVENTION

An acoustic wave device employs an acoustic wave that propagates through or on the surface of the specific binding material, whereby any changes to the characteristics of the propagation path affect the velocity and/or amplitude of the wave. The presence of functionalization material on or over an active region of an acoustic wave device permits an analyte to be bound to the functionalization material, thereby altering the mass being vibrated by the acoustic wave and altering the wave propagation characteristics (e.g., velocity, thereby altering resonance frequency). Changes in velocity can be monitored by measuring the frequency or phase characteristics of the sensor and can be correlated to a physical quantity being measured.

Hexagonal crystal structure piezoelectric materials such as AlN and ZnO are of commercial interest due to their piezoelectric and electroacoustic properties. A primary use of electroacoustic technology has been in the telecommunication field (e.g., oscillators, filters, delay lines, etc.). More recently, there has been a growing interest in using electroacoustic devices in high frequency sensing applications due to the potential for high sensitivity, resolution, and reliability. However, it is not trivial to apply electroacoustic technology in certain sensor applications—particularly sensors operating in liquid or viscous media (e.g., chemical and biochemical sensors)—since longitudinal and surface waves exhibit considerable acoustic leakage into such media, thereby resulting in reduced resolution.

In the case of a piezoelectric crystal resonator, an acoustic wave may embody either a bulk acoustic wave (BAW) propagating through the interior (or "bulk") of a piezoelectric material, or a surface acoustic wave (SAW) propagating on the surface of the piezoelectric material. SAW devices involve transduction of acoustic waves (commonly including two-dimensional Rayleigh waves) utilizing interdigital transducers along the surface of a piezoelectric material, with the waves being confined to a penetration depth of about one wavelength.

BAW devices typically involve transduction of an acoustic wave using electrodes arranged on opposing top and bottom surfaces of a piezoelectric material. In a BAW device, different vibration modes can propagate in the bulk material, including a longitudinal mode and two differently polarized shear modes wherein the longitudinal and shear bulk modes propagate at different velocities. The longitudinal mode is characterized by compression and elongation in the direction of the propagation, whereas the shear modes consist of motion perpendicular to the direction of propagation with no local change of volume. The propagation characteristics of these bulk modes depend on the material properties and propagation direction respective to the crystal axis orientations. Because shear waves exhibit a very low penetration depth into a liquid, a device with pure or predominant shear modes can operate in liquids without significant radiation losses (in contrast with longitudinal waves, which can be radiated in liquid and exhibit significant propagation losses). Restated, shear mode vibrations are beneficial for operation of acoustic wave devices with fluids because shear waves do not impart significant energy into fluids.

Certain piezoelectric thin films are capable of exciting both longitudinal and shear mode resonance. To excite a wave including a shear mode using a standard sandwiched electrode configuration device, a polarization axis in piezoelectric thin film must generally be non-perpendicular to (e.g., tilted relative to) the film plane. Hexagonal crystal structure piezoelectric materials such as (but not limited to) aluminum nitride (AlN) and zinc oxide (ZnO) tend to develop their polarization axis (i.e., c-axis) perpendicular to the film plane, since the (0001) plane typically has the lowest surface density and is thermodynamically preferred. Certain high-temperature (e.g., vapor phase epitaxy) processes may be used to grow tilted c-axis films, but providing full compatibility with microelectronic structures such as metal electrodes or traces requires a low temperature deposition process (e.g., typically below about 300° C.).

One effect of the lack of uniformity of c-axis tilt angle of the AlN film structure over the substrate is that if the AlN film-covered substrate were to be diced into individual chips, the individual chips would exhibit significant variation in c-axis tile angle and concomitant variation in acoustic wave propagation characteristics. Such variation in c-axis tile angle would render it difficult to efficiently produce large numbers of resonator chips with consistent and repeatable performance.

Typically, BAW devices are fabricated by micro-electromechanical systems (MEMS) fabrication techniques owing to the need to provide microscale features suitable for facilitating high frequency operation. In the context of biosensors, functionalization materials (e.g., specific binding materials; also known as bioactive probes or agents) may be deposited on sensor surfaces by various techniques, such as microarray spotting (also known as microarray printing). Functionalization materials providing non-specific binding utility (e.g., permitting binding of multiple types or species of molecules) may also be used in certain contexts, such as chemical sensing. A biosensor (or biological sensor) is an analytical device including a biological element that converts a biological response into an electrical signal. Certain biosensors involve a selective biochemical reaction between a specific binding material and a binding target (e.g., a molecule, protein, DNA, virus, bacteria, etc.), and the product of this specific binding reaction is converted into a measurable quantity by a transducer. Other sensors may utilize a non-specific binding material capable of binding multiple types or classes of molecules or other moieties that may be present in a sample. Transduction methods used with biosensors may be based on various principles, such as electrochemical, optical, electrical, acoustic, and so on. Among these, acoustic transduction offers a number of potential advantages, such as being real time, label free, and low cost, as well as exhibiting high sensitivity. In the context of filters, BAW devices can be used in a wide range of applications, for example, mobile products, radar systems, and communications systems, among other applications. BAW filters operate by converting electrical energy into acoustic or mechanical energy on a piezoelectric material. BAW filters can operate at high frequencies and are not as sensitive to temperature as SAW filters. Additionally, BAW filters deliver superior performance with lower insertion loss at higher frequency levels.

Fabricating a BAW resonator device may involve depositing an acoustic reflector over a substrate, followed by deposition of a bottom side electrode, followed by growth (e.g., via sputtering or other appropriate methods) of a piezoelectric material, followed by deposition of a top side electrode. Growth of a piezoelectric material could be by chemical vapor deposition (CVD), reactive RF magnetron sputtering (e.g., of Al ions in a nitrogen gas environment), etc. These techniques are capable of forming layers that are uniformly thick (e.g., piezoelectric material via sputtering), although some layers may have portions of differing heights depending on the topography of an underlying material deposition surface. For example, a bottom side electrode may not cover an entirety of the underlying acoustic reflectors, such that a material deposition surface including the foregoing layers over a substrate may include bottom side electrode material that is slightly raised with respect to a top surface of the acoustic reflector. Upon application of a uniformly thick piezoelectric material over the material deposition surface, portions of the piezoelectric material positioned over the bottom side electrode will be raised relative to other portions of the piezoelectric material that are not overlying the bottom side electrode.

Improved methods and systems for producing bulk films with c-axis tilt have been described, where the c-axis tilt of the bulk layer is primarily controlled by controlling the deposition angle. For example, a device and method for depositing seed and bulk layers with a tilted c-axis are described in U.S. Pat. App. Pub. No. 2017/0110300 entitled "Deposition System for Growth of Inclined C-Axis Piezoelectric Material Structures;" U.S. Pat. No. 10,574,204 entitled "Acoustic Resonator Structure with Inclined C-Axis Piezoelectric Bulk and Crystalline Seed Layers;" and U.S. patent application Ser. No. 10,063,210 entitled "Methods for Producing Piezoelectric Bulk and Crystalline Seed Layers of Different c-Axis Orientation Distributions."

Further improvements are desired to provide, for example, one or more of: reduction of the initial surface roughness of electrodes, reduction of rounding of electrodes, increased surface uniformity of electrode structures, heightened detectability of the electrode structure generation process used, reduction of short range frequency variation, increased repeatability of resonator spurious content across wafers, enhancement of control over the angle of the c-axis of crystals in bulk material layers, improvement of characteristics such as mechanical quality factor and coupling coefficient, and improvement of manufacturing efficiency of bulk material layers.

SUMMARY OF THE INVENTION

Aspects of the present disclosure relate to methods and structures for generating smooth electrodes and electrode structures with a uniformly smooth surface.

In some aspects, methods for generating an electrode structure comprising one or more smooth electrodes comprise generating one or more electrodes comprising an initial surface roughness on a first portion of a substrate. In some embodiments, the methods comprise generating a sacrificial cap on each of the one or more electrodes. In some embodiments, the methods comprise generating a planarization film on the substrate and on at least a portion of the sacrificial cap. In some embodiments, the methods comprise conducting a first planarization procedure to remove at least a portion of the planarization film and at least a first portion of the sacrificial cap. In some embodiments, the methods comprise removing at least a second portion of the sacrificial cap to prepare the electrodes for reduction of the initial surface roughness. In some embodiments the methods comprise conducting a second planarization procedure to remove at least a third portion of the sacrificial cap and to reduce the initial surface roughness of the one or more electrodes, thereby smoothing the one or more electrodes.

In some embodiments, the sacrificial cap comprises a c-bridge. In some embodiments, at least a portion of the c-bridge remains on the electrode structure after conducting the second planarization procedure. In some embodiments, the c-bridge connects the one or more electrodes to acoustic energy management layers embedded within the substrate.

In some embodiments, the sacrificial cap comprises a bottom aluminum nitride layer disposed directly on the electrode, a tungsten layer disposed over the bottom aluminum nitride layer, and a top aluminum nitride layer disposed over the tungsten layer. In some embodiments, the first portion of the sacrificial cap removed using the first planarization procedure comprises the top aluminum nitride layer and at least a first portion of the tungsten layer. In some embodiments, removing at least the second portion of the sacrificial cap comprises removing at least a second portion of the tungsten layer using wet or dry etching. In some embodiments, dry etching comprises plasma etching, and wet etching comprises solution-based etching. In some embodiments, the third portion of the sacrificial cap removed using the second planarization procedure comprises at least a first portion of the bottom aluminum nitride layer.

In some embodiments, the one or more electrodes comprise a tungsten layer disposed over a layer comprising a metal, a metal alloy, or any combination thereof. In some embodiments, the metal is selected from the group consisting of: Tungsten (W), Aluminum (Al), Copper (Cu), Titanium (Ti), Molybdenum (Mo), Platinum (Pt), Ruthenium (Ru), Iridium (Ir), and any combination thereof. In some embodiments, the metal alloy is an aluminum-copper (AlCu) alloy or a Titanium-Tungsten (TiW) alloy.

In some embodiments, the substrate comprises a planarization film. In some embodiments, the planarization film comprises silicon dioxide, TEOS, or any combination thereof. In some embodiments, a plurality of acoustic energy management layers are embedded within the substrate. In some embodiments, the plurality of acoustic energy management layers comprises a plurality of acoustic reflector layers. In some embodiments, the first planarization procedure comprises chemical-mechanical polishing (CMP), or wherein the second planarization procedure comprises chemical-mechanical polishing (CMP), or wherein the first and second planarization procedures comprise chemical-mechanical polishing (CMP). In some embodiments, the one or more electrodes are configured for deposition of a piezoelectric material layer on the top surface of the one or more electrodes, the piezoelectric material layer comprising a c-axis having an orientation substantially perpendicular to the top surface of the one or more electrodes.

In some embodiments, generating the one or more electrodes comprises depositing the one or more electrodes, patterning the one or more electrodes, or any combination thereof. In some embodiments, generating the sacrificial cap on each of the one or more electrodes comprises depositing the sacrificial cap, patterning the sacrificial cap, or any combination thereof. In some embodiments, generating the planarization film comprises depositing the planarization film on the substrate, patterning the planarization film, or any combination thereof. In some embodiments, patterning comprises performing: a lithography process, an etching process, or any combination thereof.

In some aspects, methods for generating an electrode structure comprising a uniformly smooth surface comprise generating one or more electrodes on a first portion of a substrate, wherein each of the one or more electrodes comprise an initial surface roughness. In some embodiments, the methods comprise generating a sacrificial cap on each of the one or more electrodes. In some embodiments, the methods comprise generating a planarization film on the substrate and at least a portion of the sacrificial cap. In some embodiments, the methods comprise conducting a first planarization procedure to remove at least a portion of the planarization film and at least a first portion of the sacrificial cap, wherein the sacrificial cap preserves the uniformity of the surface of the electrode structure during the first planarization procedure. In some embodiments, the methods comprise removing at least a second portion of the sacrificial cap to prepare the electrodes for reduction of the initial surface roughness. In some embodiments, the methods comprise conducting a second planarization procedure to remove at least a third portion of the sacrificial cap and to reduce the initial surface roughness from each of the one or more electrodes, thereby generating an electrode structure comprising a uniformly smooth surface.

In some embodiments, the method further comprises depositing a piezoelectric material layer onto the top surface of the one or more electrodes, the piezoelectric material layer comprising a c-axis having an orientation substantially perpendicular to the top surface of each of the one or more electrodes. In some embodiments, the sacrificial cap comprises a c-bridge. In some embodiments, at least a portion of the c-bridge remains on the structure after conducting the second planarization procedure. In some embodiments, the c-bridge connects the one or more electrodes to acoustic energy management layers embedded within the substrate. In some embodiments, the piezoelectric material layer comprises a seed layer and a bulk material layer. In some embodiments, depositing the piezoelectric material layer comprises depositing the seed layer onto the top surface of each of the one or more electrodes before depositing the bulk material layer. In some embodiments, the piezoelectric material layer comprises a material selected from the group consisting of: AlN, ScAlN, ZnO, PZT, and any combination thereof.

In some embodiments, the sacrificial cap comprises a bottom aluminum nitride layer disposed directly on the electrode, a tungsten layer disposed over the bottom aluminum nitride layer; and a top aluminum nitride layer disposed over the tungsten layer. In some embodiments, the first portion of the sacrificial cap removed using the first planarization procedure comprises a first portion of the top aluminum nitride layer and at least a first portion of the tungsten layer.

In some embodiments, removing the second portion of the sacrificial cap comprises removing a second portion of the tungsten layer using wet or dry etching. In some embodiments, dry etching comprises plasma etching, and wet etching comprises solution-based etching. In some embodiments, the third portion of the sacrificial cap removed using the second planarization procedure comprises at least a first portion of the bottom aluminum nitride layer.

In some embodiments, each of the one or more electrodes comprise a tungsten layer disposed over a layer comprising a metal, a metal alloy, or any combination thereof. In some embodiments, the metal is selected from the group consisting of: Tungsten (W), Aluminum (Al), Copper (Cu), Titanium (Ti), Molybdenum (Mo), Platinum (Pt), Ruthenium (Ru), Iridium (Ir), and any combination thereof. In some embodiments, the metal alloy is an aluminum-copper (AlCu) alloy or a Titanium-Tungsten (TiW) alloy.

In some embodiments, the substrate comprises a planarization film. In some embodiments, the planarization film comprises silicon dioxide, TEOS, or any combination thereof. In some embodiments, a plurality of acoustic energy management layers are embedded within the substrate. In some embodiments, the plurality of acoustic energy management layers comprises a plurality of acoustic reflector layers. In some embodiments, the plurality of acoustic reflector layers comprises tungsten, silicon dioxide, an aluminum-copper alloy, or any combination thereof.

In some embodiments, the first planarization procedures comprises chemical-mechanical polishing (CMP), or wherein the second planarization procedure comprises chemical-mechanical polishing (CMP), or wherein the first and second planarization procedures comprise chemical-mechanical polishing (CMP). In some embodiments, generating one or more electrodes comprises depositing the one or more electrodes, patterning the one or more electrodes, or any combination thereof. In some embodiments, generating the sacrificial cap on each of the one or more electrodes comprises depositing the sacrificial cap, patterning the sacrificial cap, or any combination thereof.

In some embodiments, generating a planarization film comprises depositing the planarization film on the substrate, patterning the planarization film, or any combination thereof. In some embodiments, patterning comprises performing: a lithography process, an etching process, or any combination thereof.

In some aspects, protected structures for generating an electrode structure comprising a uniformly smooth surface comprise a substrate, one or more electrodes disposed on at least a portion of the substrate, and a sacrificial cap disposed on each of the one or more electrodes, wherein the sacrificial cap comprises a c-bridge.

In some embodiments, the c-bridge connects the one or more electrodes to acoustic energy management layers embedded within the substrate. In some embodiments, the sacrificial cap comprises a bottom aluminum nitride layer disposed directly on the electrode, a tungsten layer disposed over the bottom aluminum nitride layer, and a top aluminum nitride layer disposed over the tungsten layer.

In some embodiments, the one or more electrodes comprise a tungsten layer disposed over a layer comprising a metal, a metal alloy, or any combination thereof. In some embodiments, the metal is selected from the group consisting of: Tungsten (W), Aluminum (Al), Copper (Cu), Titanium (Ti), Molybdenum (Mo), Platinum (Pt), Ruthenium (Ru), Iridium (Ir), and any combination thereof. In some embodiments, the metal alloy is an aluminum-copper (AlCu) alloy or a Titanium-Tungsten (TiW) alloy.

In some embodiments, the substrate comprises a planarization film. In some embodiments, the planarization film comprises silicon dioxide, TEOS, or any combination thereof. In some embodiments, a plurality of acoustic energy management layers are embedded within the substrate. In some embodiments, the plurality of acoustic energy management layers comprises a plurality of acoustic reflector layers. In some embodiments, the plurality of acoustic reflector layers comprises tungsten, silicon dioxide, an aluminum-copper alloy, or any combination thereof.

In some aspects, electrode structures comprising a uniformly smooth surface comprise a substrate, a planarization film disposed on the substrate, the planarization film comprising an upper surface, and one or more electrodes disposed on the substrate, wherein a sacrificial cap on each of the one or more electrodes preserved the uniformity of the surface of the electrode structure during a first planarization procedure, and wherein the one or more electrodes and the upper surface of the planarization film were smoothed by a second planarization procedure.

In some embodiments, the sacrificial cap comprises a c-bridge. In some embodiments the electrode structure further comprises at least a portion of the c-bridge. In some embodiments the one or more electrodes comprise a tungsten layer disposed over a layer comprising a metal, a metal alloy, or any combination thereof. In some embodiments, the metal is selected from the group consisting of: Tungsten (W), Aluminum (Al), Copper (Cu), Titanium (Ti), Molybdenum (Mo), Platinum (Pt), Ruthenium (Ru), Iridium (Ir), and any combination thereof. In some embodiments, the metal alloy is an aluminum-copper (AlCu) alloy or a Titanium-Tungsten (TiW) alloy.

In some embodiments, the substrate comprises a planarization film. In some embodiments, the planarization film comprises silicon dioxide, TEOS, or any combination thereof. In some embodiments, a plurality of acoustic energy management layers are embedded within the substrate. In some embodiments, the plurality of acoustic energy management layers comprises a plurality of acoustic reflector layers. In some embodiments, the plurality of acoustic reflector layers comprises tungsten, silicon dioxide, an aluminum-copper alloy, or any combination thereof.

In some aspects, piezoelectric structures with increased surface uniformity comprise an electrode structure described herein and a piezoelectric material layer disposed on a top surface of the one or more electrodes, the piezoelectric material layer comprising a c-axis having an orientation substantially perpendicular to a top surface of each of the one or more electrodes.

In some embodiments, the piezoelectric material layer comprises a seed layer and a bulk material layer. In some embodiments, the piezoelectric material layer comprises a material selected from the group consisting of: AlN, ScAlN, ZnO, PZT, and any combination thereof.

These and further aspects will be further explained in the rest of the disclosure, including the Examples.

DETAILED DESCRIPTION OF THE PREFERRED EMBODIMENTS

Figure 1:
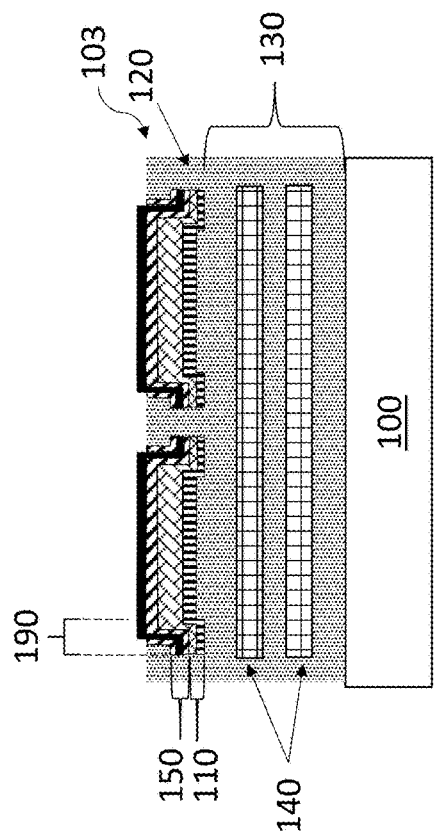
FIGS. 1 and 2 are schematic cross-sectional views of protected structures for generating an electrode structure with a uniformly smooth surface.

The practice of the present invention will employ, unless otherwise indicated, conventional techniques of silicon fabrication in the field of biosensors. Such techniques are explained fully in the literature, such as "Acoustic-Based Biosensors," (Durmus et al., 2014); "Recent Advances in Acoustic Wave Biosensors for the Detection of Disease-related Biomarkers: A review," (Zhang et al., 2021); and "Acoustic Biosensors and Microfluidic Devices in the Decennium: Principles and Applications," (Nair, et al., 2021).

Where a range of values is provided, it is understood that each intervening value, to the tenth of the unit of the lower limit unless the context clearly dictates otherwise, between the upper and lower limit of that range and any other stated or intervening value in that stated range is encompassed within the invention. The upper and lower limits of these smaller ranges may independently be included in the smaller ranges is also encompassed within the invention, subject to any specifically excluded limit in the stated range. Where the stated range includes one or both of the limits, ranges excluding either or both of those included limits are also included in the invention.

In the following description, numerous specific details are set forth to provide a more thorough understanding of the present invention. However, it will be apparent to one of skill in the art that the present invention may be practiced without one or more of these specific details. In other instances, well-known features and procedures well known to those skilled in the art have not been described in order to avoid obscuring the invention.

All references cited throughout the disclosure, including patent applications and publications, are incorporated by reference herein in their entirety.

I. Definitions

By "comprising," it is meant that the recited elements are required in the composition/method/kit, but other elements can be included to form the composition/method/kit etc. within the scope of the claim.

By "consisting essentially of," it is meant a limitation of the scope of composition or method described to the specified materials or steps that do not materially affect the basic and novel characteristic(s) of the subject invention.

By "consisting of," it is meant the exclusion from the composition, method, or kit of any element, step, or ingredient not specified in the claim.

By "incidence angle," is meant the angle at which particles are deposited onto a substrate, measured as the angle between the deposition pathway and a normal of the surface plane of the substrate.

By "substrate," is meant a material onto which a seed layer or a bulk material layer may be deposited. The substrate may be, for example, a wafer, or may be a part of a resonator device complex or wafer, which may also include other components, such as an electrode structure arranged over at least a portion of the substrate. A seed layer is not considered to be "a substrate" in the examples of this disclosure.

By deposition of crystals "on a substrate," it is meant that there may be intervening layers (e.g., a seed layer) between the substrate and the crystals. However, the expressions "directly on a substrate" or "on the surface of the substrate" are intended to exclude any intervening layers.

By "piezoelectric material layer" is meant a portion of a bulk material layer, a bulk material layer, a seed layer and a portion of a bulk material layer, or a seed layer and a bulk material layer, or any combination thereof.

By "pre-seed layer" is meant a layer deposited before a seed layer, and that can function to control at least one property of a seed layer formed thereon.

By "seed layer" is meant a layer onto which a bulk material layer may be deposited.

By "bulk material layer" or "bulk layer" is meant a crystalline layer deposited on an electrode or on a seed layer. A bulk material layer may be formed in one or more steps.

Figure 12:
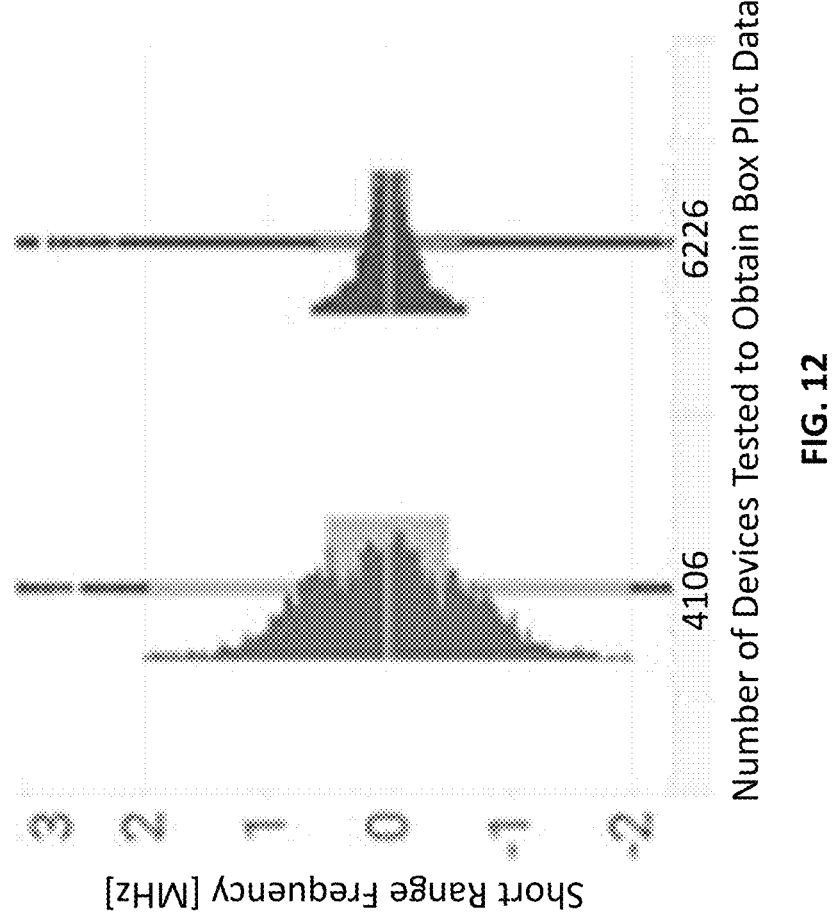
FIG. 12 shows two box plots, each with short range frequency variation (MHz) shown on the y-axis. The box plot on the left is the short range frequency variation of devices using previously known techniques, while the box plot on the right is the short range frequency variation of devices when using the methods and structures described herein (right). The x-axis lists the number of devices tested to obtain the data for each box plot.

By "c-axis," is meant the direction of crystal growth emanating from the same origin as the "a" axes and perpendicular to the plane of the "a" axes of a hexagonal system, as shown in FIG. 12. The c-axis is typically the longitudinal axis of the crystal.

Figure 8:
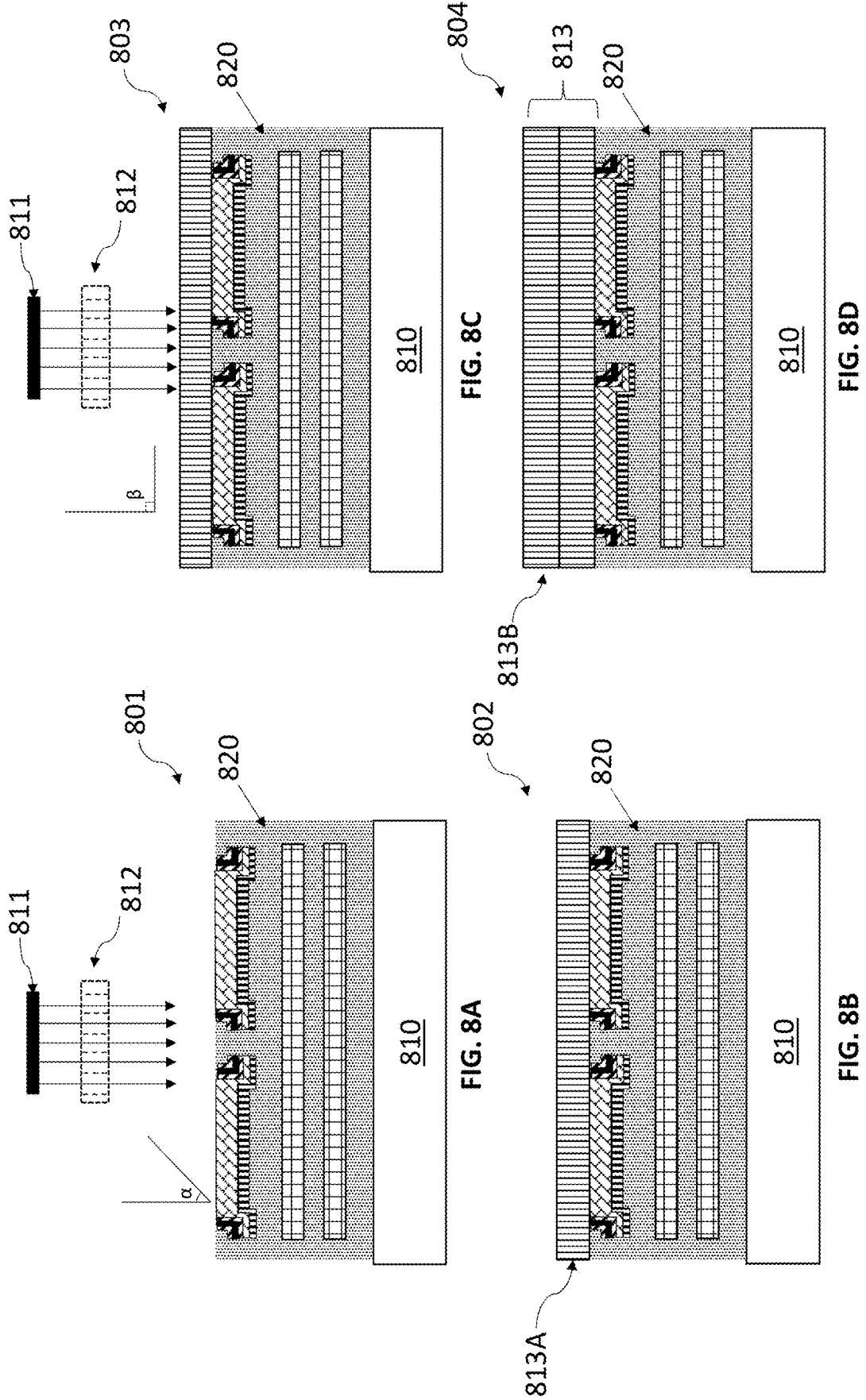
FIGS. 8A-8C are schematic cross-sectional views of a process for depositing a piezoelectric material layer comprising an on-axis tilt onto the top surface of an electrode.
FIG. 8D is a schematic illustration of a piezoelectric structure after depositing a piezoelectric material layer comprising an on-axis tilt.
Figure 9:
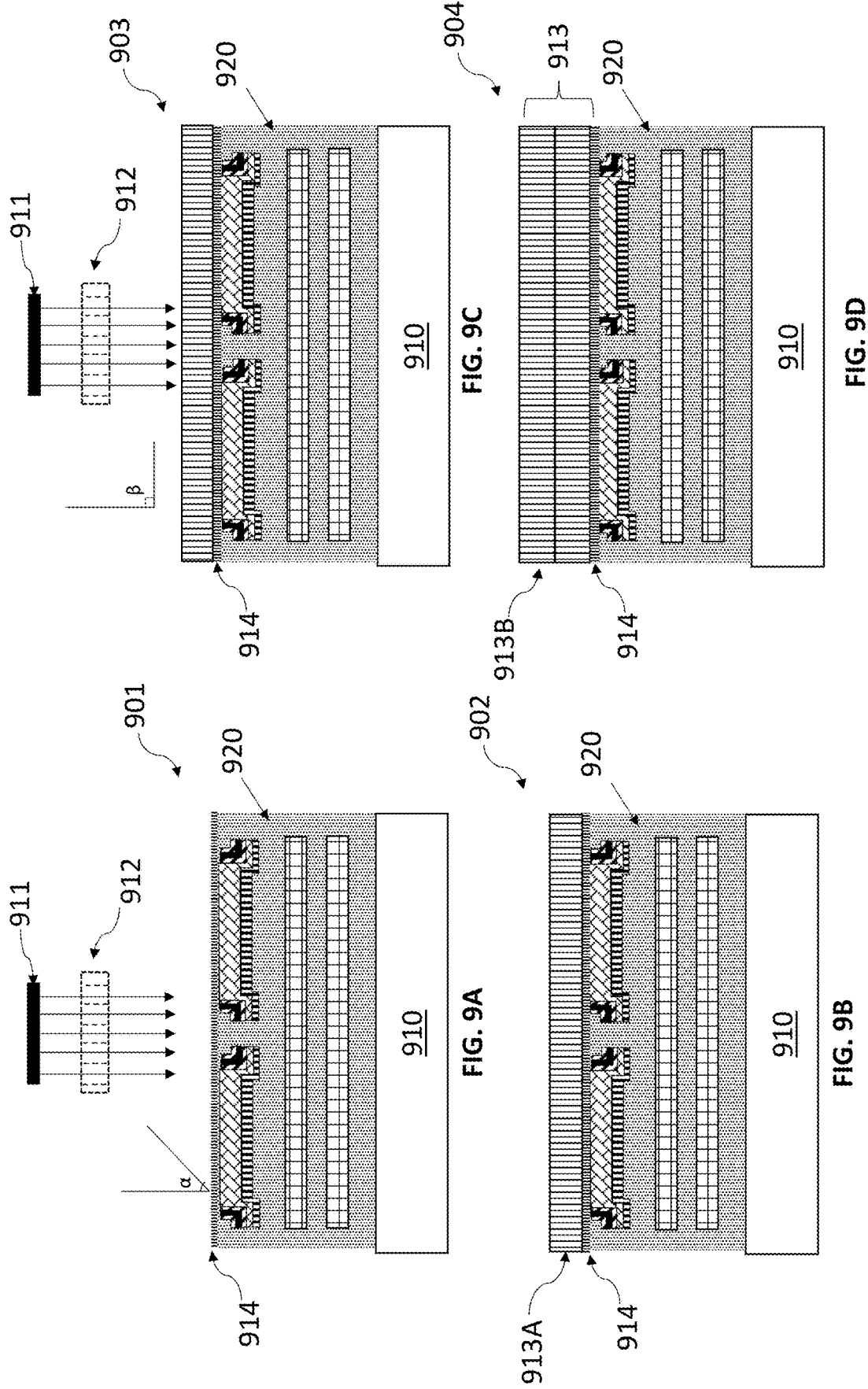
FIGS. 9A-9C are schematic cross-sectional views of a process for depositing a piezoelectric material layer onto the top surface of an electrode, the piezoelectric material layer comprising a seed layer comprising an on-axis tilt and a bulk material layer.
FIG. 9D is a schematic illustration of a piezoelectric structure after depositing a piezoelectric material layer comprising an on-axis tilt.

By "c-axis tilt," "c-axis orientation," or "c-axis incline," is meant the angle of the c-axis relative to a normal of a top surface of an electrode, as shown in FIG. 8A as angle alpha ($\alpha$). It should be understood that even if a single angular value is given, the crystals in a deposited crystal layer (e.g., a seed layer or a bulk material layer) may exhibit a distribution of angles. The distribution of angles typically approximately follows a normal (e.g., Gaussian) distribution that can be graphically demonstrated, for example, as a two-dimensional plot resembling a bell-curve, or by a pole figure.

By "on-axis" or "on-axis tilt" is meant a c-axis tilt, c-axis orientation, or a c-axis incline that is substantially perpendicular, as defined herein, to a top surface of an electrode.

By "off-axis" or "off-axis tilt" is meant a c-axis tilt, c-axis orientation, or a c-axis incline that is not substantially perpendicular, as defined herein, to a top surface of an electrode.

By "perpendicular" and "substantially perpendicular" with regard to the orientation, tilt, or incline of a c-axis in relation to the electrode, it is meant that the c-axis of the deposited crystal is substantially perpendicular to the top surface of the electrode.

By "substantially" is meant same meaning as "nearly completely," and can be understood to modify the term that follows by at least about 90%, at least about 95%, or at least about 98%.

By "parallel" and "substantially parallel" with regard to resulting piezoelectric material layer crystals it is meant that the resulting piezoelectric material layer crystals have the same or a similar c-axis tilt.

By "electrode structure" is meant a structure in which at least one electrode is disposed on a substrate, without a piezoelectric material disposed thereon.

By "piezoelectric structure" is meant a structure in which an electrode structure has a piezoelectric material disposed thereon.

By "sacrificial cap" is meant a material or combination of materials disposed on an electrode, which preserves the uniformity of the electrode and/or the surface uniformity of the electrode structure.

By "first planarization procedure" is meant a procedure that removes at least a portion of a planarization film and/or at least a portion of a sacrificial cap.

By "second planarization procedure" is meant a procedure that reduces the initial surface roughness from each of the one or more electrodes.

By "functionalization material" is meant to generally relate to both specific and non-specific binding materials.

By "about" as used in conjunction with numeric values is meant to include normal variations in measurements as expected by persons skilled in the art, and is understood to have the same meaning as "approximately" and to cover a typical margin of error, such as ±5% of the stated value.

All scientific and technical terms used herein have meanings commonly used in the art unless otherwise specified. The definitions provided herein are to facilitate understanding of certain terms used frequently herein and are not meant to limit the scope of the patent disclosure.

As used here, the singular forms "a," "an," and "the" encompass examples having plural referents, unless the content clearly dictates otherwise.

As used here, the term "or" is generally employed in its sense including "and/or" unless the content clearly dictates otherwise. The term "and/or" means one or all of the listed elements or a combination of any two or more of the listed elements.

As used here, "have," "having," "include," "including," "comprise," "comprising," or the like are used in their open-ended sense, and generally mean "including, but not limited to." It will be understood that "consisting essentially of," "consisting of," and the like are subsumed in "comprising" and the like. As used herein, "consisting essentially of," as it relates to a composition, product, method or the like, means that the components of the composition, product, method or the like are limited to the enumerated components and any other components that do not materially affect the basic and novel characteristic(s) of the composition, product, method or the like.

The words "preferred" and "preferably" refer to examples of the invention that may afford certain benefits, under certain circumstances. However, other examples may also be preferred, under the same or other circumstances. Furthermore, the recitation of one or more preferred examples does not imply that other examples are not useful, and is not intended to exclude other examples from the scope of the disclosure, including the claims.

The recitations of numerical ranges by endpoints include all numbers subsumed within that range (e.g., 1 to 5 includes 1, 1.5, 2, 2.75, 3, 3.8, 4, 5, etc. or 10 or less includes 10, 9.4, 7.6, 4.3, 2.9, 1.62, 0.3, etc.). Where a range of values is "up to" a particular value, that value is included within the range.

Any direction referred to here, such as "top," "bottom," "left," "right," "upper," "lower," and other directions and orientations are described herein for clarity in reference to the figures and are not to be limiting of an actual device or system or use of the device or system. Devices or systems as described herein may be used in a number of directions and orientations.

II. Detailed Description

The present disclosure provides methods and structures for generating smooth electrodes and electrode structures with a uniformly smooth surface. As compared to conventional resonator structures, fabrication methods, and deposition systems, various examples of the present disclosure reduce the initial surface roughness of electrodes, reduce rounding of electrodes, increase surface uniformity of electrode structures, reduce short range frequency variation, improve repeatability of resonator spurious content across wafers, enhance control over the angle of the c-axis of crystals in bulk material layers, improve characteristics such as mechanical quality factor and coupling coefficient, and improve manufacturing efficiency of bulk material layers.

Examples and embodiments described herein may be used, for example with the methods and devices described in, for example, U.S. Pat. No. 11,369,960 (filed May 6, 2020) to Rivas et al., entitled "Acoustic Resonator Device;" U.S. Pat. No. 10,063,210 (filed Oct. 13, 2016) to McCarron et al., entitled 'Methods for Producing Piezoelectric Bulk and Crystalline Seed Layers of Different C-Axis Orientation Distributions;" and U.S. Pat. No. 10,541,663 (filed Oct. 13, 2016) to McCarron et al., entitled "Multi-Stage Deposition System for Growth of Inclined C-Axis Piezoelectric Material Structures," all of which are incorporated by reference herein in their entireties.

Figure 3:
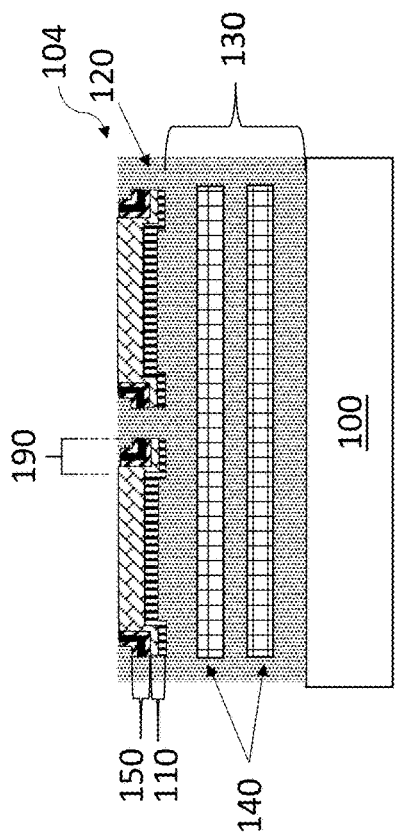
FIG. 3 is a schematic cross-sectional view of the protected structure of FIG. 2 after conducting a first planarization procedure to remove at least a portion of the planarization film and at least a first portion of the sacrificial cap.
Figure 2:
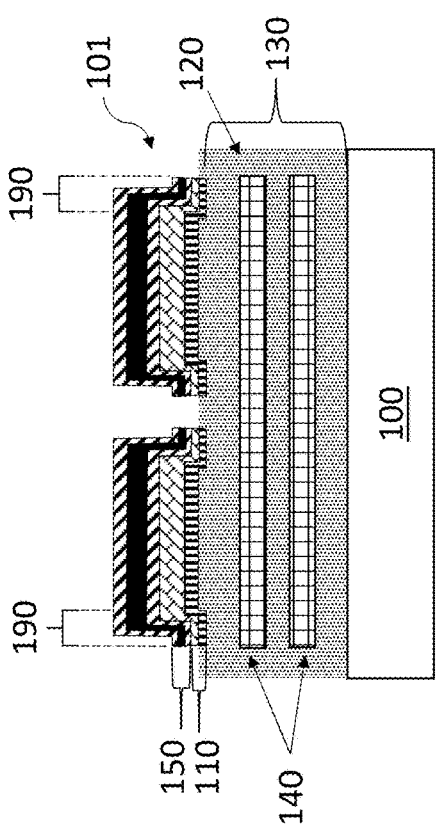
Figure 4:
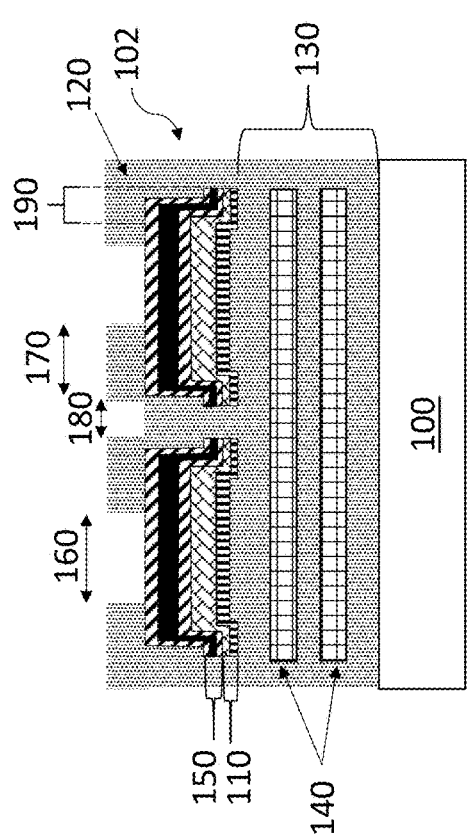
FIG. 4 is a schematic cross-sectional view of an electrode structure including smooth electrodes with reduced surface roughness configured for deposition of an on-axis piezoelectric material layer after conducting a second planarization procedure.
Figure 5:
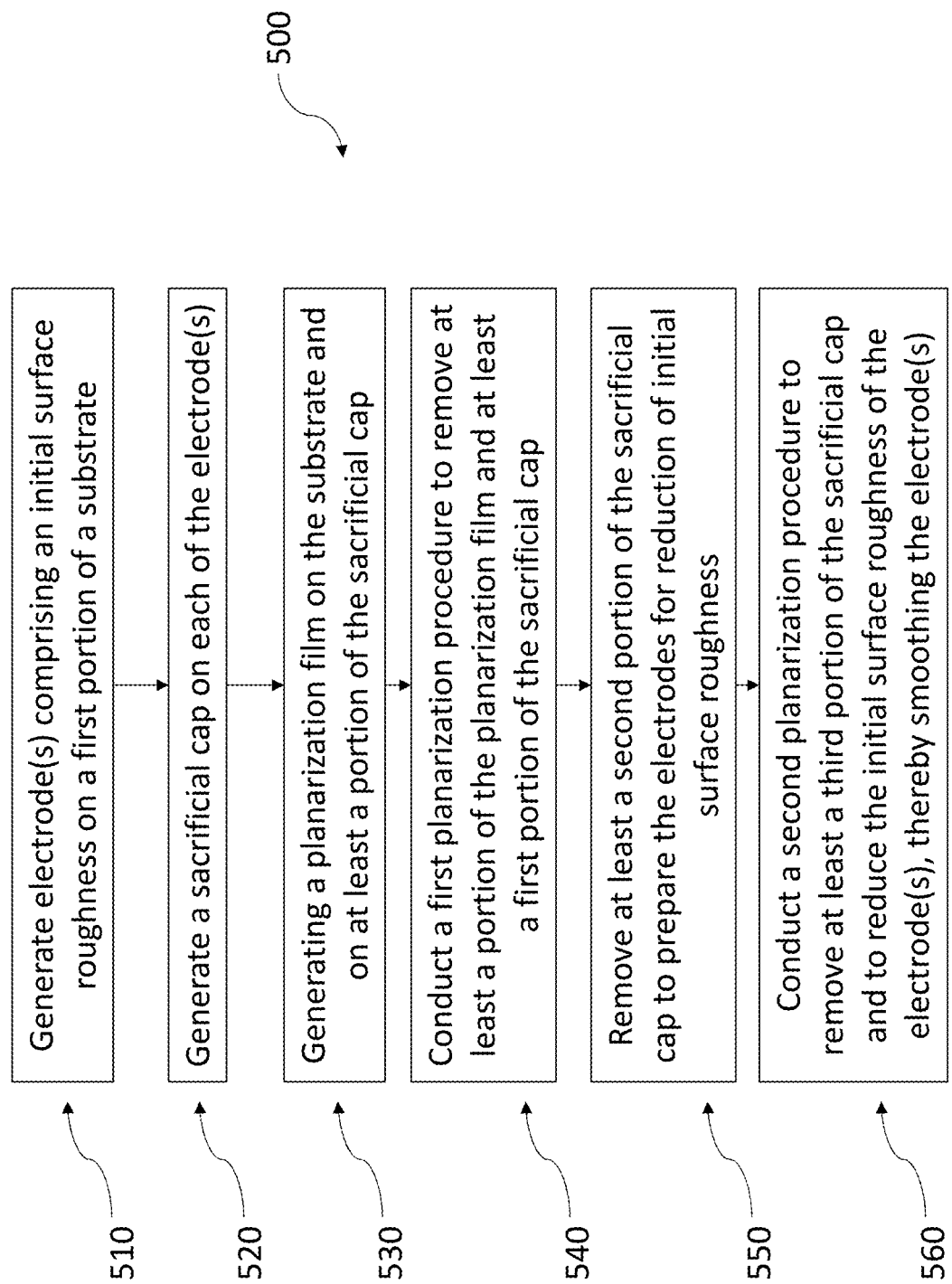
FIG. 5 is a schematic illustration of a method for generating an electrode structure comprising one or more smooth electrodes.

FIGS. 1-4 show various stages of a method for generating an electrode structure comprising one or more smooth electrodes and a uniformly smooth surface. Particularly, FIGS. 1 and 2 show protected structures 101 and 102 for generating an electrode structure comprising one or more smooth electrodes and a uniformly smooth surface. FIG. 3 shows a resulting structure 103 of structures 101 and 102 of FIGS. 1 and 2 after conducting a first planarization procedure to remove at least a portion of the planarization film and at least a first portion of a sacrificial cap 150. FIG. 4 shows an electrode structure 104 with a uniformly smooth surface including electrode(s) with a smooth surface. FIG. 5 shows steps for generating an electrode structure comprising one or more smooth electrodes (e.g., wherein the original surface roughness has been reduced).

In some examples, an acoustic resonator structure is prepared in a deposition system and at least one wafer comprising a substrate 100 is received by a support surface (not shown).

Electrodes

Aspects of the invention include electrode structures that can be used in conjunction with the methods and systems described herein. One or more electrodes 110 can be generated on a first portion of substrate 100. Generating electrodes 110 can comprise depositing the electrodes, patterning the electrodes, or any combination thereof. The one or more electrodes 110 can comprise an initial surface roughness. The initial surface roughness of the electrodes 110 can be the same or may vary at the time of generation. In some embodiments, the electrodes 110 comprise a tungsten layer disposed over a layer comprising a metal, a metal alloy, or any combination thereof. For example, the electrode material can comprise W, Al, Cu, AlCu, Mo, Pt, Ru, Ti, TiW, and/or Ir. It is understood that an Aluminum Copper (AlCu) alloy can be any alloy comprising aluminum and copper at varying ratios. Similarly, any alloy referenced or described may comprise the included metals in varying ratios.

In one preferred embodiment, the electrodes 110 are bottom electrodes of a set of top and bottom electrodes of an acoustic resonator device. The electrodes 110 may be generated such that they are configured for deposition of a piezoelectric material layer comprising an on-axis tilt on the top surface of the electrode. This will be described in further detail below with respect to FIGS. 8A-8D and 9A-9D.

Substrate

Aspects of the invention include substrates that can be used in conjunction with the methods and systems described herein. The substrate 100 which may be received by a support surface and comprise a planarization film 120. In other examples, the planarization film 120 is generated on the substrate 100. Generating the planarization film 120 on substrate 100 can comprise depositing the planarization film, patterning the planarization film, or any combination thereof. The planarization film can comprise silicon, silicon dioxide, or any other semiconductor materials, as well as any other suitable materials that find use in semiconductor manufacturing processes.

In some embodiments, the substrate 100 comprises one or a plurality of acoustic energy management layers 130 embedded underneath electrode 110 and above an upper surface of substrate 100. In some embodiments, the acoustic energy management layers 130 can be embedded within the planarization film 120 of the substrate 100 or the planarization film 120 that is generated on the substrate 100. In some embodiments, the acoustic energy management layers 130 can comprise one or a plurality of acoustic reflector layers 140. For example, in some embodiments there are seven acoustic reflector layers. In some embodiments there may be two or five acoustic reflector layers, for example. The number of acoustic reflector layers and energy management layers can vary depending on the application. The acoustic reflector layers 140 can comprise W, $SiO_2$, and/or AlCu. The acoustic reflector layers 140 are used to reflect acoustic waves, and therefore, reduce or avoid their dissipation in the substrate 100. In some embodiments, the acoustic reflector layers 140 are Bragg reflectors.

In other embodiments, the substrate 100 may define a recess or a plurality of recesses (not shown), with a support layer arranged over the recess. The recess may serve a similar purpose as the acoustic reflector layers 140. That is, to reflect acoustic waves and reduce or avoid their dissipation in the substrate 100. It should be understood that although the acoustic reflector layers and the recesses serve a similar purpose, they can be implemented separately or together.

Examples and embodiments described herein may be used, for example, with the structures and methods describe in, for example, U.S. Pat. App. Pub. No. 2022/0274104 (filed May 19, 2022) to Rivas et al., entitled "Acoustic Resonator Device" which is incorporated by reference herein in its entirety.

Sacrificial Caps

Aspects of the invention include one or more sacrificial caps that can be used in conjunction with the methods and systems described herein. In some embodiments, a sacrificial cap 150 is generated on each of the one or more electrodes 110. Generating the sacrificial cap 150 on electrode 110 can comprise depositing the sacrificial cap, patterning the sacrificial cap, or any combination thereof. The sacrificial cap 150 can preserve the uniformity of the electrodes 110, preserve the uniformity of the electrode structures 101-104, prepare the electrodes 110 for reduction of initial surface roughness, and decreases rounding, among other features described herein.

In some embodiments, a sacrificial cap 150 can comprise a bottom aluminum nitride layer disposed directly on electrode 110, a tungsten layer disposed over the bottom aluminum nitride layer, and a top aluminum nitride layer disposed over the tungsten layer. In some embodiments, the top aluminum nitride layer can act as an etch stop during planarization film patterning. In some embodiments, the bottom aluminum nitride layer can protect the electrode 110 during removal of the tungsten layer. Depending on the thickness of the aluminum nitride layers and the planarization procedures used, the thickness of the desired tungsten layer may vary. Ensuring that the tungsten layer of the sacrificial cap 150 is at least a minimum thickness ensures that the sacrificial cap 150 will not be permeated during the first planarization procedure. If the sacrificial cap 150 is permeated during the first planarization procedure, then the uniformity of the electrode and surface of the electrode structure may not be preserved. In some embodiments, the minimum thickness of the tungsten layer of the sacrificial cap 150 ranges from 200 angstroms to 2000 angstroms, such as about 250 angstroms, 500 angstroms, 750 angstroms, 1000 angstroms, 1250 angstroms, 1500 angstroms, or 1750 angstroms.

In some embodiments, the sacrificial cap(s) can comprise a c-bridge 190. The c-bridge can connect the one or more electrodes to the acoustic energy management layers 130 embedded within the substrate. Connecting the c-bridge of the one or more electrodes to the acoustic energy management layers 130 can lower the resistance of the material by placing two resistors in parallel. Examples and embodiments described herein may be used, for example with the methods and devices described in, for example, U.S. Pat. App. Pub. No. 2022/0131521 (filed Feb. 16, 2022) to Yusuf et al., entitled "Bulk Acoustic Wave Filter Structure with Conductive Bridge Forming Electrical Loop with an Electrode," which is incorporated by reference herein in its entirety.

Planarization Film

Aspects of the invention include a planarization film that can be used in conjunction with the methods and systems described herein. In FIG. 1, planarization film 120 has been generated on substrate 100, but has not yet been generated on a portion of sacrificial cap 150. FIG. 2 shows the planarization film 120 generated on the substrate and at least a portion of the sacrificial cap 150. Generating the planarization film 120 on at least a portion of the sacrificial cap 150 can occur simultaneously with generation of the planarization film 120 on the substrate 100. Alternatively, the planarization film 120 may be generated on the sacrificial cap 150 after the planarization film 120 is generated on the substrate 100. In yet other embodiments, the planarization film 120 and the sacrificial cap 150 are both part of the substrate 100 when it is received by the support surface.

In FIG. 2, the planarization film 120 is on the substrate 100 and at least a portion of the sacrificial cap 150. When the planarization film 120 is generated, (which can comprise silicon dioxide or tetraethyl orthosilicate (TEOS; tetraethoxysilane) among other materials and combinations), a TEOS opening 160 can be created. The TEOS opening 160 may be created using an etching procedure, such as a dry etching procedure. The width of the TEOS opening 160 can range from about 10 μm to about 1000 μm, such as about 100 μm, 200 μm, 300 μm, 400 μm, 500 μm, 600 μm, 700 μm, 800 μm, or 900 μm. Additionally, in some embodiments, a TEOS fence 170 may be created. In some embodiments, the TEOS fence 170 can be created by patterning the planarization film and by etching partially over the bottom electrode using lithography and/or etching processes. In some embodiments, divots can be created due to the topography of the incoming substrate. The width of the TEOS fence 170 can range from about 100 nm to about 5000 nm (5 μm), such as about 500 nm, 1000 nm, 1500 nm, 2000 nm, 2500 nm, 3000 nm, 3500 nm, 4000 nm, or 4500 nm. In some embodiments, a middle opening 180 between the sacrificial caps may form naturally. In some embodiments, the TEOS fence corner promotes the effectiveness of planarization procedures, such as chemical mechanical polishing (CMP). Non-limiting examples of planarization procedures are described herein.

First Planarization Procedure

Aspects of the invention include one or more first planarization procedures that can be used in conjunction with the methods and systems described herein. In some embodiments, a first planarization procedure can be used to planarize the substrate 100, planarization film 120, and/or sacrificial caps 150 to a desirable level. The desirable level may be a level within the sacrificial cap such that the sacrificial cap is configured to be removed by one or more subsequent etching procedures. The first planarization procedure can also be used to remove a portion of the sacrificial cap 150, while promoting the uniformity of the planarization film 120, electrodes 110, and the electrode structures on substrate 100.

FIG. 3 shows the structure of FIG. 2 after conducting a first planarization procedure to remove at least a portion of the planarization film 120 and at least a first portion of the sacrificial cap 150. Sometimes, the first planarization procedure has a target stop level within the sacrificial cap 150 or within a specific layer of the sacrificial cap 150, such as a tungsten layer. The sacrificial cap 150 preserves the uniformity of the electrodes and the uniformity of the surface of the electrode structure during the first planarization procedure. In some embodiments, the at least a first portion of the sacrificial cap 150 removed using the first planarization procedure comprises the top aluminum nitride layer and at least a portion of the tungsten layer.

During the first planarization procedure, depending on the materials used and the type of first planarization procedure employed, the planarization film 120 and the materials of the sacrificial cap 150 can be removed at different rates. For example, an aluminum nitride layer may degrade faster than a tungsten layer. A planarization film 120 that comprises silicon dioxide may degrade faster than an aluminum nitride layer of the sacrificial cap 150. The varying speeds at which the materials are removed during the first planarization procedure dictates the precision with which the first planarization procedure can be conducted. For example, in some embodiments, at least a portion of the sacrificial cap 150, such as a tungsten layer, can be removed at a much lower rate compared to the rate at which a planarization film 120 is removed. The varying rates of removal ensure that the sacrificial cap 150 withstands the first planarization procedure and protects the electrode, preparing it for removal of initial surface roughness. One non-limiting example of a first planarization procedure is chemical mechanical polishing (CMP). Other forms of first planarization procedures are contemplated as well.

Removing the Second Portion of the Sacrificial Cap

As reviewed above, in order to preserve the uniformity of the electrodes and the surface of electrode structures, the sacrificial cap 150 is employed. Following removal of at least a portion of the planarization film 120 and at least a first portion of the sacrificial cap 150 during a first planarization procedure, a second portion of the sacrificial cap 150 can be removed to prepare the electrodes 110 for reduction of initial surface roughness.

Removing the second portion of the sacrificial cap 150 to prepare the electrodes 110 for reduction of initial surface roughness can comprise using wet or dry etching, or both. In some embodiments, where the sacrificial cap 150, prior to a first planarization procedure, comprises a bottom aluminum nitride layer, a tungsten layer, and a top aluminum nitride layer, the second portion of the sacrificial cap 150 is removed by removing the tungsten layer using wet or dry etching. In some embodiments the bottom aluminum nitride layer may be removed using wet or dry etching as well. In some examples, wet, solution-based chemical etching is used to remove an aluminum nitride layer(s) of the sacrificial cap 150, while dry chemical etching is used to remove tungsten layer(s) of the sacrificial cap 150.

During the first planarization procedure, the sacrificial cap preserves the uniformity of the electrodes 110, increases uniformity of the surface of electrode structure 101, and decreases rounding of the electrodes 110. The second portion of the sacrificial cap is removed in a manner that prepares the electrode 110 for reduction of initial surface roughness, while continuing to preserve the uniformity of electrode 110, preserve the surface uniformity of the electrode structure, and decrease rounding of electrode 110. After preparing the electrodes 110 for reduction of initial surface roughness, a second planarization procedure may occur.

Second Planarization Procedure

Aspects of the invention include second planarization procedures that can be used in conjunction with the methods and systems described herein. In some embodiments, a second planarization procedure can be used to remove at least a third portion of the sacrificial cap 150 and to reduce the initial surface roughness (smooth and touch-up) the electrodes 110 and electrode structures, including the planarization film 120, thereby configuring the electrodes for deposition of a piezoelectric material layer. The second planarization procedure can comprise chemical mechanical polishing (CMP), among other procedures. After the first, second, or third portions of the sacrificial cap 150 have been removed and/or after the second planarization procedure has been conducted, at least portions of the c-bridge 190 can remain on the electrode structure, heightening the ability to detect the electrode structure generation process which was used. The second planarization procedure reduces the initial surface roughness of the electrodes, generating smooth electrodes configured for deposition of a piezoelectric material layer onto the top surface of the one or more electrodes. The smooth electrodes may be particularly well-suited for deposition of a piezoelectric material layer comprising a c-axis having an orientation substantially perpendicular to the top surface of each of the one or more electrodes. FIG. 4 shows an electrode structure including smooth electrodes with reduced surface roughness configured for deposition of an on-axis piezoelectric material layer after conducting a second planarization procedure.

Aspects of the invention include methods for generating an electrode structure comprising one or more smooth electrodes using a series of steps as shown, for example, in FIG. 5. FIG. 5 shows steps of a process 500 for generating an electrode structure comprising one or more smooth electrodes (i.e., wherein the original surface roughnesses have been reduced). At step 510, one or more electrodes may be generated comprising an initial surface roughness on a substrate. The one or more electrodes can be generated on a portion of the substrate. At step 520, a sacrificial cap is generated on the one or more electrodes. The sacrificial cap can comprise a c-bride. Generating the sacrificial cap may include depositing the sacrificial cap, patterning the sacrificial cap, or any combination thereof. At step 530, a planarization film can be generated on the substrate and on at least a portion of the sacrificial cap. At step 540, a first planarization procedure may be conducted to remove at least portions of the planarization film and at least a first portion of the sacrificial cap. The first planarization procedure can be a chemical mechanical polishing procedure (CMP). The sacrificial cap may be thick enough such that the planarization procedure does not permeate the sacrificial cap, such that the uniformity of the electrodes and surface uniformity of the electrode are preserved. At step 550, the sacrificial cap can be removed to prepare the electrodes for reduction of the initial surface roughness. At step 560, a second planarization procedure can be conducted to remove at least a third portion of the sacrificial cap and to reduce the initial surface roughness of the electrode(s), thereby smoothing the electrodes(s) which can decrease short range frequency variation and increase repeatability of resonator spurious content across wafers. After the second planarization procedure is conducted, portions of the c-bridge can remain on the electrode structure, heightening the detectability of the electrode structure generation process used.

Piezoelectric Material Layer

Examples and embodiments described herein may be used, for example, with the structures and methods described in, for example U.S. Pat. App. Pub. No. 2019/0296710 (Filed Mar. 20, 2019) to Deniz et al., entitled "Piezoelectric Bulk Layers With Tilted C-Axis Orientation and Methods for Making the Same," which is incorporated by reference herein in its entirety.

Figure 6:
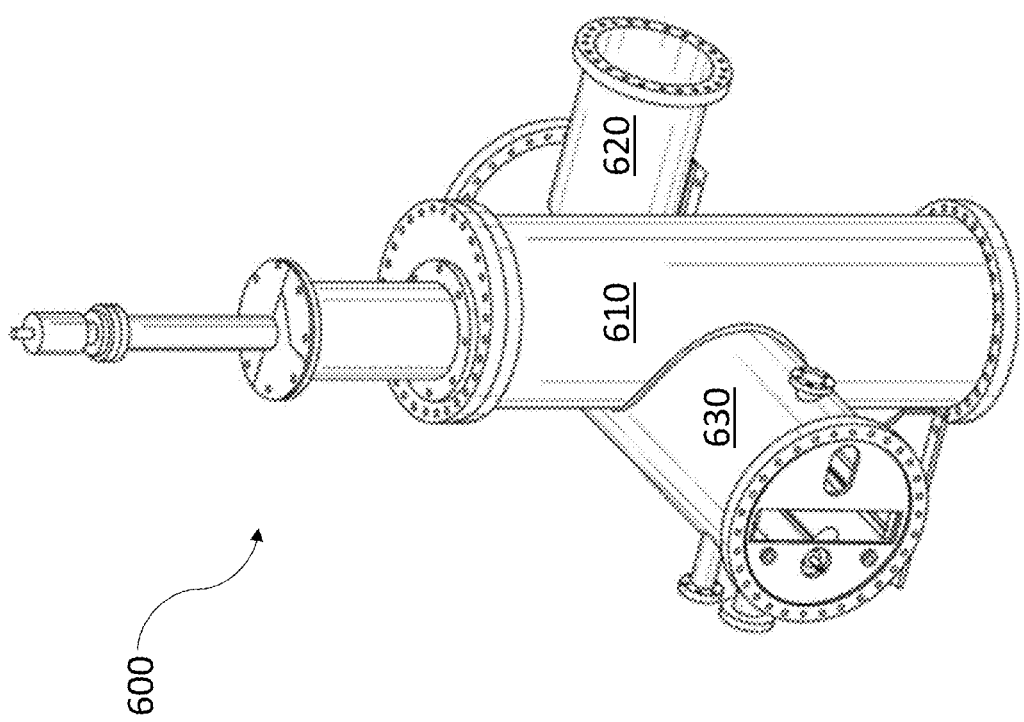
FIG. 6 is an upper exterior perspective view of the reactor 600 of a deposition system for growing a hexagonal crystal structure piezoelectric material with a c-axis having an orientation substantially perpendicular to the one or more electrodes, the system including a linear sputtering apparatus, a movable substrate table for supporting multiple substrates, and a collimator.

FIG. 6 shows a reactor 600 in accordance with embodiments of a deposition system for growing a hexagonal crystal structure piezoelectric material with a c-axis having an orientation substantially perpendicular to the top surface of a substrate or an electrode, the reactor 600 includes first, second, and third tubular portions 610, 620, and 630, for housing various elements used for depositing material onto a substrate.

Figure 7:
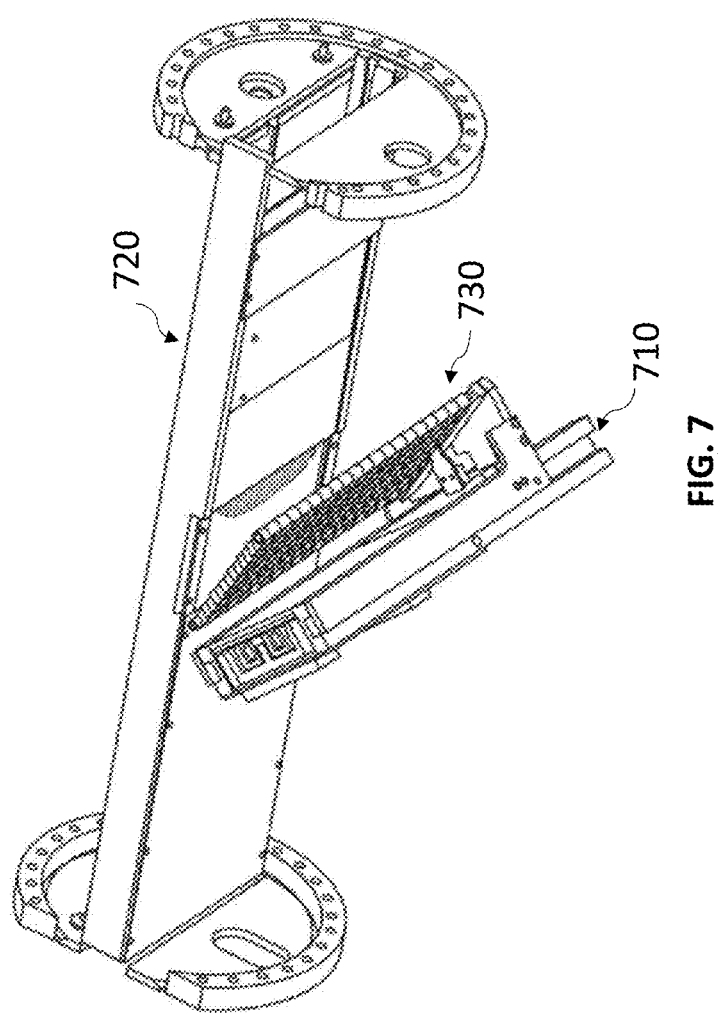
FIG. 7 is an upper perspective view of some of the elements of the reactor of FIG. 6, including a linear sputtering apparatus, a translation track for translating a movable substrate table for supporting multiple substrates, and a collimator.

FIG. 7 shows some of the elements of the reactor 600 of FIG. 6, including a linear sputtering apparatus 710, a translation track 720 for translating a movable substrate table for supporting multiple substrates, and a collimator assembly 730.

FIGS. 8A-8D show an example of a two-step piezoelectric material layer deposition process.

FIGS. 8A and 8B show a first growth step that includes ejecting metal atoms from a target 812 of a linear sputtering apparatus (such as linear sputtering apparatus 710 of FIG. 7) to react with a gas species forming a deposition flux 812 to be received by the substrate 810 and any objects that have been generated on the substrate. The deposition system can include a multi-aperture collimator (such as collimator 730 of FIG. 7) arranged between the target 811 and the substrate 810.

The deposition flux 812 can be directed through apertures of the collimator 730 to help control the incidence angle during deposition. The deposition flux 812 arrives at the substrate 810 at a first incidence angle α, forming a first portion 813A of the bulk material layer 813 (shown in FIG. 8D). For example, the first incidence angle α can be about 0 degrees (i.e., normal to and substantially perpendicular to the surface plane of the substrate 810 or electrodes). The crystals of the first portion 813A of the bulk material layer 813 comprise an on-axis tilt. In some embodiments, the bulk material layer 813 comprising an on-axis tilt is deposited onto the top surface of an electrode structure comprising a smooth surface. The bulk material layer 813 can be deposited onto the top surface of electrode(s) configured for deposition of a bulk material layer comprising an on-axis tilt.

FIGS. 8C and 8D show a second growth step, where metal atoms are ejected from target 811 to react with a gas species and to be received by the first portion 813A already deposited onto the substrate 810. The target 111 may be the same or a different target than the one that ejected metal atoms in the first growth step. In the second growth step, the target 111 can be positioned such that the second incidence angle β is the same as, larger than, or smaller than the first incidence angle α. For example, the second incidence angle β can be about 0 degrees (i.e., normal to and substantially perpendicular to the surface plane of the substrate 810 or electrodes). The deposition flux 812 in the second growth step forms a second portion 813B of the bulk material layer 813. The crystals of the second portion 813B of the bulk material layer 813 comprise an on-axis tilt. Collectively, the first and second portions of the bulk material layer 813 form a piezoelectric material layer. The second growth step can be done with or without a collimator.

The first portion 813A, second portion 813B, or both can be a piezoelectric material layer. The piezoelectric material layer may also comprise a seed layer or a pre-seed layer, as discussed below with respect to FIGS. 9A-9D. In some embodiments, the bulk material layer 813 includes more than first and second portions. The bulk material layer 813 can be deposited in many different steps to create many portions.

In some embodiments, the on-axis tilt of the second portion 813B follows or substantially follows the on-axis tilt of the first portion 813A of the bulk material layer 813. In some embodiments, the on-axis tilt of the first and second portions 813A and 813B aligns or at least substantially aligns with the first incidence angle α used during the first growth step. The resulting piezoelectric material layer crystals of the first portion 813A and second portion 813B may be substantially parallel to one another and at least substantially align with the desired on-axis tilt. The resulting piezoelectric material layer crystals of the first portion 813A and the second portion 813B can also be substantially parallel within each portion. For example, at least 50%, at least 75%, or at least 90% of the crystals of the first portion 813A can have an on-axis tilt that is within 0 degrees to 10 degrees of the average on-axis tilt, and a direction that is within 0 degrees to 60 degrees, or within 0 degrees to 20 degrees of the average crystal direction. Similarly, at least 50%, at least 75%, or at least 90% of the crystals of the second portion 813B may have an on-axis tilt that is within 0 degrees to 10 degrees of the average on-axis tilt, and a direction that is within 0 degrees to 60 degrees, or within 0 degrees to 20 degrees of the average crystal direction.

Optionally, as shown in FIGS. 9A-9D, a first portion 913A of a bulk material layer 913 may be deposited onto a seed layer 914, which has been deposited onto the substrate 110 or any object generated thereon, such as an electrode. In some embodiments, the seed layer 914 is deposited onto the top surface of an electrode before depositing the bulk material layer 913. In some examples, a pre-seed layer is deposited prior to depositing the seed layer 914. The resulting piezoelectric material layer can comprise the seed layer 914 comprising an on-axis tilt and a bulk material layer. As shown, the bulk material layer 913 may have first and second portions, or any number of portions, depending on the number of deposition steps used during the piezoelectric material layer deposition process.

Figure 10:
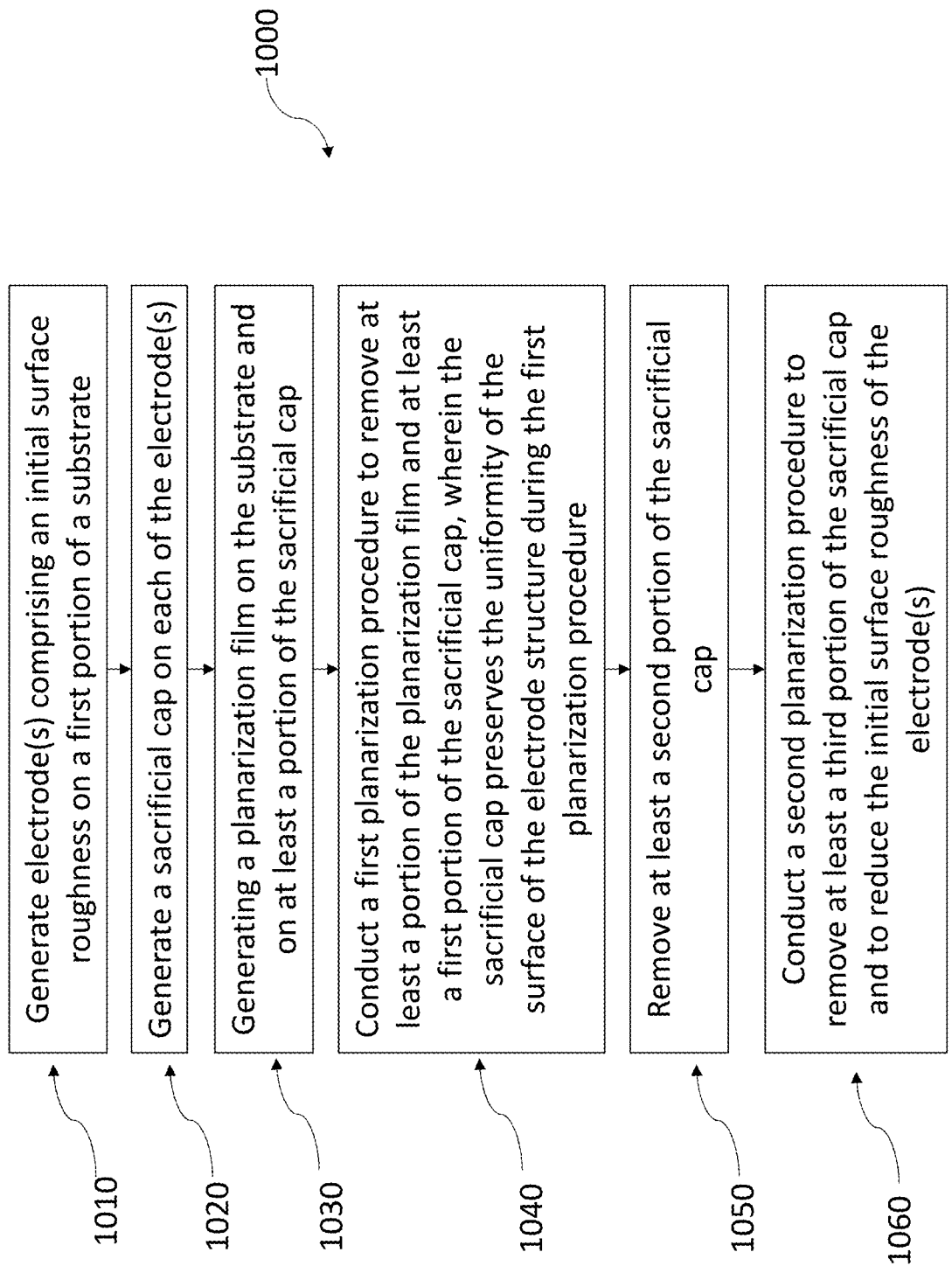
FIG. 10 is a schematic illustration of a method for generating an electrode structure comprising a uniformly smooth surface.

FIG. 10 shows steps of a process 1000 for generating an electrode structure comprising a uniformly smooth surface. At step 1010, one or more electrodes can be generated comprising an initial surface roughness on a substrate. The one or more electrodes can be generated on a portion of the substrate. At step 1020, a sacrificial cap is generated on the one or more electrodes. Generating the sacrificial cap can include depositing the sacrificial cap, patterning the sacrificial cap, or any combination thereof. At step 1030, a planarization film may be generated on the substrate and on at least a portion of the sacrificial cap. At step 1040, a first planarization procedure can be conducted to remove at least a portion of the planarization film and at least a first portion of the sacrificial cap, wherein the sacrificial cap preserves the uniformity of the electrodes and the uniformity of the surface of the electrode structure during the first planarization procedure. The first planarization procedure can be a chemical mechanical polishing (CMP) procedure. The sacrificial cap may be thick enough such that the first planarization procedure does not permeate the sacrificial cap and prepares the electrodes for removal of initial surface roughness while maintaining surface uniformity of the electrode structure. At step 1050, at least a second portion of the sacrificial cap can be removed. At step 1060 a second planarization procedure can be conducted to remove at least a third portion of the sacrificial cap and to reduce the initial surface roughness of the electrode(s), thereby smoothing the electrodes(s). After the second planarization procedure is conducted, portions of the c-bridge can remain on the electrode structure, heightening the detectability of the electrode structure generation process used. In some embodiments, a piezoelectric material comprising an on-axis tilt can be deposited onto the top surface of the one or more electrodes, the substrate, an object generated thereon, or any combination thereof, thereby generating a piezoelectric structure with enhanced longitudinal mode piezoelectric response.

Figure 11:
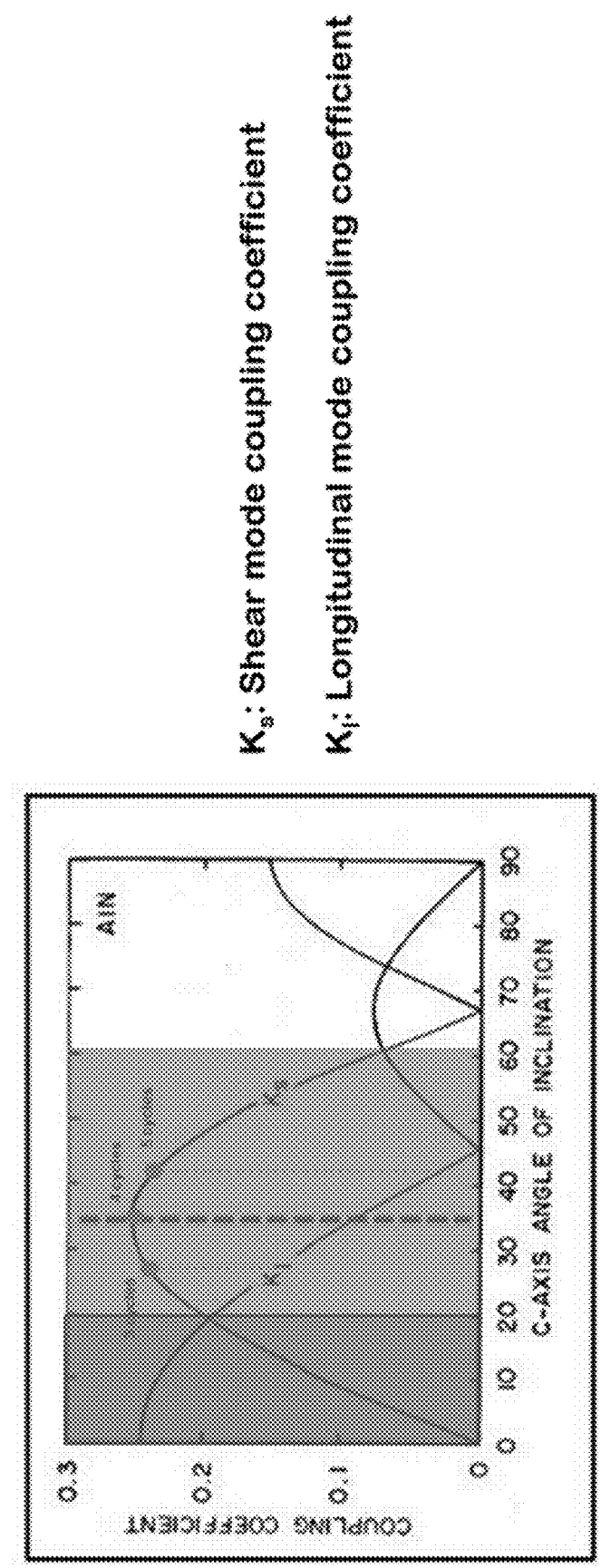
FIG. 11 is a plot of shear coupling coefficient ($K_s$) and longitudinal coupling coefficient ($K_l$) as a function of c-axis angle of inclination for AlN.

FIG. 11 shows a plot of shear mode coupling coefficient ($K_s$) and longitudinal coupling coefficient ($K_l$) as a function of c-axis angle of inclination for AlN. As shown, the longitudinal mode coupling coefficient is the dominant mode at least when the c-axis tilt of the piezoelectric material layer is between 0 and 20 degrees.

FIG. 12 shows two box plots with short range frequency variation (MHZ) shown on the y-axis. The box plot on the left is the short range frequency variation of the process of record, while the box plot on the right is the short range frequency variation when using the methods and structures described herein (right). The x-axis lists the number of devices used to obtain the boxplot data. As illustrated, using the methods and structures described herein decreases short range frequency variation.

Aspects of the invention include structures that incorporate the various elements described herein. For example, aspects of the invention include protected structures for generating an electrode structure comprising a uniformly smooth surface, electrode structures comprising a uniformly smooth surface, and piezoelectric structures with increased surface uniformity, among other structures.

For example, in some embodiments, protected structures for generating an electrode structure comprising a uniformly smooth surface comprises a substrate, one or more electrodes disposed on at least a portion of the substrate, and a sacrificial cap disposed on the electrode, wherein the sacrificial cap comprises a c-bridge.

In other embodiments, an electrode structures comprising a uniformly smooth surface comprises a substrate, a planarization film disposed on the substrate, the planarization film comprising an upper surface, and one or more electrodes disposed on the substrate, wherein a sacrificial cap on each of the one or more electrodes preserved the uniformity of the surface of the electrode structure during a first planarization procedure, and wherein the one or more electrodes and the upper surface of the planarization film were smoothed by a second planarization procedure.

Methods of Use

Aspects of the invention include methods for reducing the initial surface roughness of electrodes, reducing rounding of electrodes, increasing surface uniformity of electrode structures, heightening the detectability of the electrode structure generation process used, reducing short range frequency variation, increasing the repeatability of resonator spurious content across wafers, enhancing control over the angle of the c-axis of crystals in bulk material layers, improving characteristics such as mechanical quality factor and coupling coefficient, and improving manufacturing efficiency of bulk material layers.

EXAMPLES

Figure 13A:
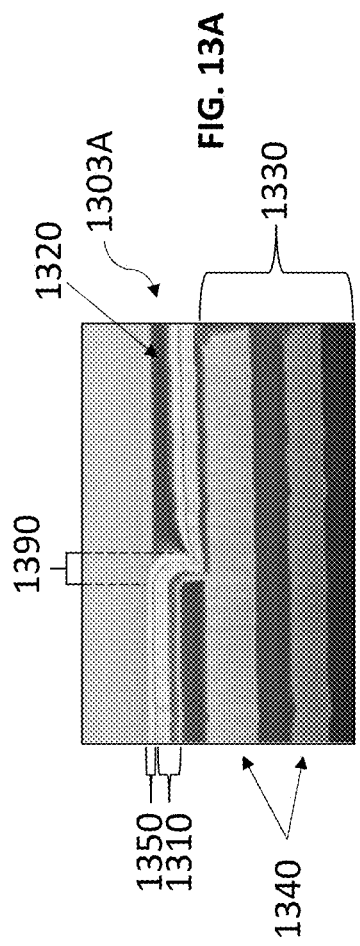
FIG. 13A is a real cross-sectional view of a protected structure after conducting a first planarization procedure to remove at least a portion of the planarization film and at least a first portion of the sacrificial cap.

Example 1: FIG. 13A is an example of a real cross-sectional view of a protected structure 1303A after conducting a first planarization procedure to remove at least a portion of the planarization film 1320 and at least a first portion of the sacrificial cap 1350. As shown by this example, the first planarization procedure may have a target stop level within the sacrificial cap 1350 or within a specific layer of the sacrificial cap 1350, such as a tungsten layer.

Figure 13B:
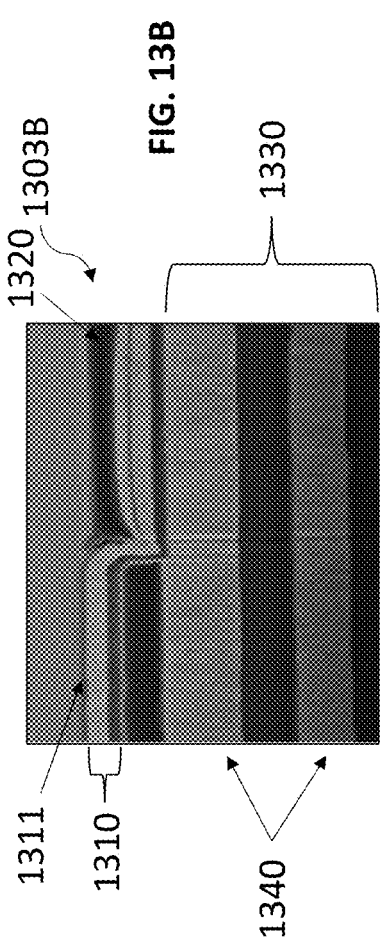
FIG. 13B is a real cross-sectional view of an electrode structure after removing at least a second portion of the sacrificial cap to prepare the electrodes for reduction of initial surface roughness.

Example 2: FIG. 13B is an example of a real cross-sectional view of an electrode structure 1303B after removing at least a second portion of the sacrificial cap 1350. As shown, a third portion of the sacrificial cap 1311 and an initial surface roughness of electrode 1310 may remain after removal of the second portion of the sacrificial cap 1350.

Figure 13C:
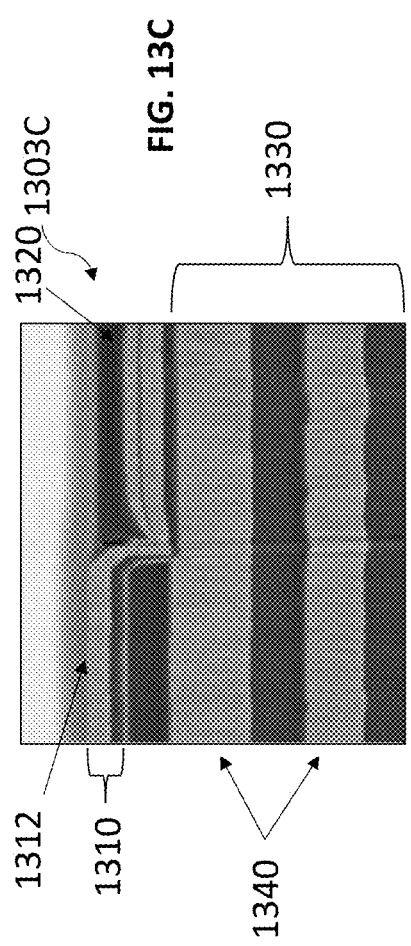
FIG. 13C is a real cross-sectional view of an electrode structure after conducting a second planarization procedure to remove at least a third portion of the sacrificial cap and to reduce the initial surface roughness of the electrode, thereby smoothing the electrode.

Example 3: FIG. 13C is an example of a real cross-sectional view of an electrode structure 1303C after conducting a second planarization procedure to remove at least a third portion 1311 of the sacrificial cap 1350 and to reduce the initial surface roughness of the electrode 1310, thereby smoothing the electrode 1310. As shown, the electrode 1310 has a smooth surface 1312 after the second planarization procedure is conducted. The resulting electrode structure comprises a uniformly smooth surface.

Figure 14:
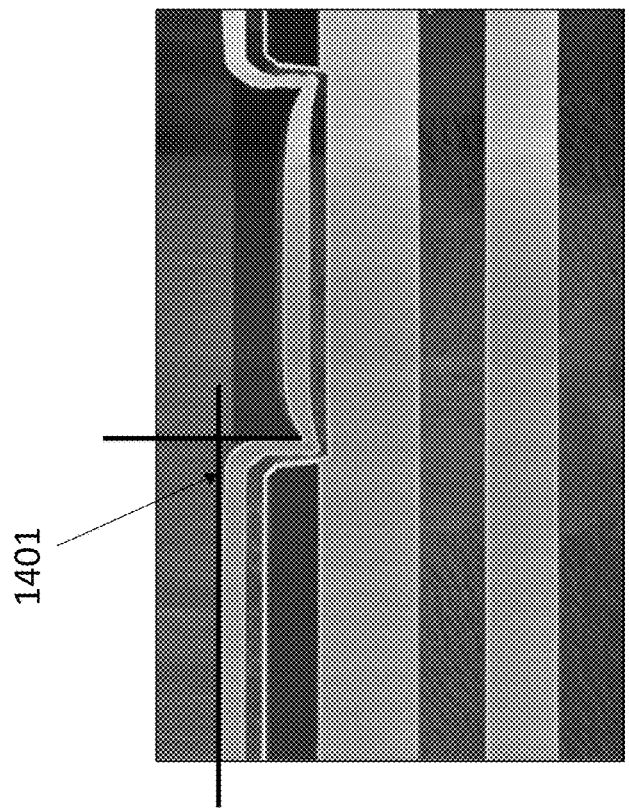
FIG. 14 is a real cross-sectional view of an electrode structure generated using, the electrodes of the electrode structure exhibiting rounding.
Figure 16:
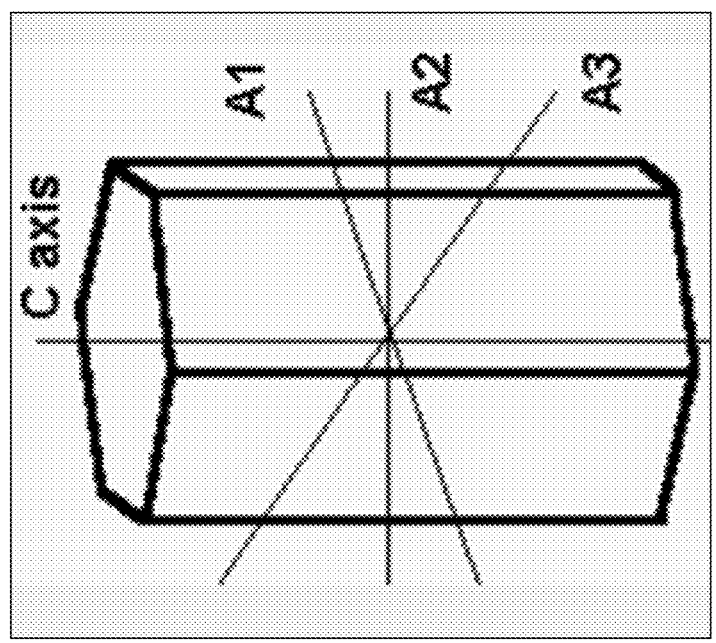
FIG. 16 is a schematic illustration of axes of a hexagonal system.

Example 4: FIG. 14 is an example of a real cross-sectional view of an electrode structure generated using previously known techniques, the electrodes of the electrode structure exhibiting rounding, as shown by 1401.

Figure 15:
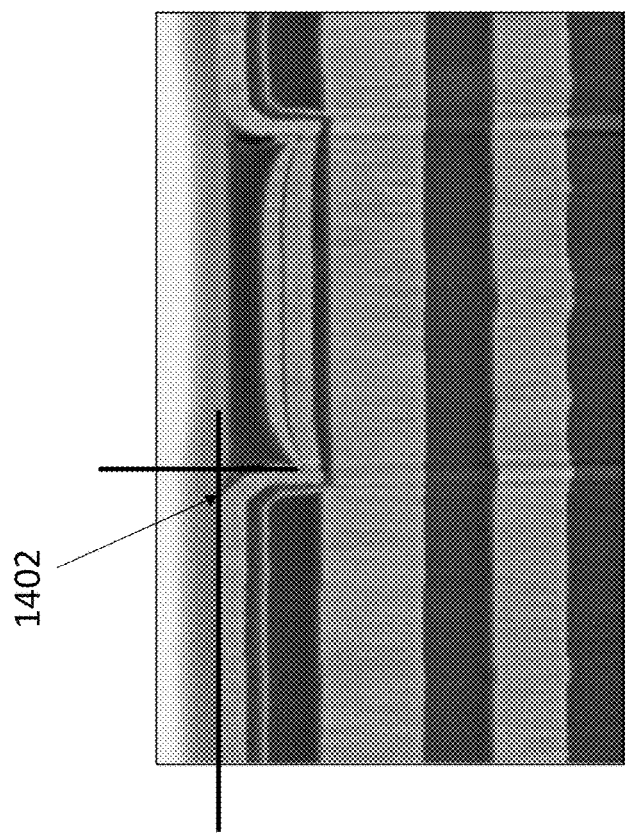
FIG. 15 is a real cross-sectional view of an electrode structure generated using the methods and structures described herein, the electrode structure having a uniformly smooth surface and smooth electrodes exhibiting decreased rounding.

Example 5: FIG. 15 is a real cross-sectional view of an electrode structure generated using the methods and structures described herein, the electrode structure having smooth electrodes with decreased rounding (as shown by 1402) and the electrode structure having a uniformly smooth surface.

While preferred embodiments of the present invention have been shown and described herein, it will be obvious to those skilled in the art that such embodiments are provided by way of example only. Numerous variations, changes, and substitutions will now occur to those skilled in the art without departing from the invention. It should be understood that various alternatives to the embodiments of the invention described herein may be employed in practicing the invention. It is intended that the following claims define the scope of the invention and that methods and structures within the scope of these claims and their equivalents be covered thereby.

The invention now being fully described, it will be apparent to one of ordinary skill in the art that various changes and modifications can be made without departing from the spirit or scope of the invention.

All references and publications cited herein are expressly incorporated herein by reference in their entirety into this disclosure, except to the extent they may directly contradict this disclosure. Although specific examples and embodiments have been illustrated and described herein, it will be appreciated by those of ordinary skill in the art that a variety of alternate and/or equivalent implementations can be substituted for the specific examples embodiments shown and described without departing from the scope of the present disclosure. It should be understood that this disclosure is not intended to be unduly limited by the illustrative examples and embodiments set forth herein and that such examples and embodiments are presented by way of example only with the scope of the disclosure to be limited only by the claims set forth here.

The invention claimed is:

1. A method for generating an electrode structure comprising one or more smooth electrodes, the method comprising:
   generating one or more electrodes comprising an initial surface roughness on a first portion of a substrate;
   generating a sacrificial cap on each of the one or more electrodes;
   generating a planarization film on the substrate and on at least a portion of the sacrificial cap;
   conducting a first planarization procedure to remove at least a portion of the planarization film and at least a first portion of the sacrificial cap;
   removing at least a second portion of the sacrificial cap to prepare the electrodes for reduction of the initial surface roughness; and
   conducting a second planarization procedure to remove at least a third portion of the sacrificial cap and to reduce the initial surface roughness of the one or more electrodes, thereby smoothing the one or more electrodes.

2. The method of claim 1, wherein the sacrificial cap comprises a c-bridge.

3. The method of claim 2, wherein at least a portion of the c-bridge remains on the electrode structure after conducting the second planarization procedure.

4. The method of claim 2, wherein the c-bridge connects the one or more electrodes to acoustic energy management layers embedded within the substrate.

5. The method of claim 1, wherein the sacrificial cap comprises:
   a bottom aluminum nitride layer disposed directly on the electrode;
   a tungsten layer disposed over the bottom aluminum nitride layer; and
   a top aluminum nitride layer disposed over the tungsten layer.

6. The method of claim 5, wherein the first portion of the sacrificial cap removed using the first planarization procedure comprises the top aluminum nitride layer and at least a first portion of the tungsten layer.

7. The method of claim 5, wherein removing at least the second portion of the sacrificial cap comprises removing at least a second portion of the tungsten layer using wet or dry etching.

8. The method of claim 5, wherein the third portion of the sacrificial cap removed using the second planarization procedure comprises at least a first portion of the bottom aluminum nitride layer.

9. The method of claim 1, wherein the one or more electrodes are configured for deposition of a piezoelectric material layer on a top surface of the one or more electrodes, the piezoelectric material layer comprising a c-axis having an orientation substantially perpendicular to the top surface of the one or more electrodes.

10. A method for generating an electrode structure comprising a uniformly smooth surface, the method comprising:
    generating one or more electrodes on a first portion of a substrate, wherein each of the one or more electrodes comprise an initial surface roughness;
    generating a sacrificial cap on each of the one or more electrodes;
    generating a planarization film on the substrate and at least a portion of the sacrificial cap;
    conducting a first planarization procedure to remove at least a portion of the planarization film and at least a first portion of the sacrificial cap, wherein the sacrificial cap preserves the uniformity of the surface of the electrode structure during the first planarization procedure;
    removing at least a second portion of the sacrificial cap to prepare the electrodes for reduction of the initial surface roughness; and
    conducting a second planarization procedure to remove at least a third portion of the sacrificial cap and to reduce the initial surface roughness from each of the one or more electrodes, thereby generating an electrode structure comprising a uniformly smooth surface.

11. The method of claim 10, wherein the sacrificial cap comprises a c-bridge.

12. The method of claim 11, wherein at least a portion of the c-bridge remains on the structure after conducting the second planarization procedure.

13. The method of claim 11, wherein the c-bridge connects the one or more electrodes to acoustic energy management layers embedded within the substrate.

14. The method of claim 10, further comprising depositing a piezoelectric material layer onto a top surface of the one or more electrodes, the piezoelectric material layer comprising a c-axis having an orientation substantially perpendicular to the top surface of each of the one or more electrodes.

15. The method of claim 14, wherein the piezoelectric material layer comprises a seed layer and a bulk material layer.

16. The method of claim 15, wherein depositing the piezoelectric material layer comprises depositing the seed layer onto the top surface of each of the one or more electrodes before depositing the bulk material layer.

17. The method of claim 10, wherein the sacrificial cap comprises:
    a bottom aluminum nitride layer disposed directly on the electrode;
    a tungsten layer disposed over the bottom aluminum nitride layer; and
    a top aluminum nitride layer disposed over the tungsten layer.

18. The method of claim 17, wherein the first portion of the sacrificial cap removed using the first planarization procedure comprises a first portion of the top aluminum nitride layer and at least a first portion of the tungsten layer.

19. The method of claim 17, wherein removing the second portion of the sacrificial cap comprises removing a second portion of the tungsten layer using wet or dry etching.

20. The method of claim 17, wherein the third portion of the sacrificial cap removed using the second planarization procedure comprises at least a first portion of the bottom aluminum nitride layer.

* * * * *